(12) United States Patent
Hemming

(10) Patent No.: US 7,139,862 B2
(45) Date of Patent: Nov. 21, 2006

(54) INTERLEAVING METHOD AND APPARATUS WITH PARALLEL ACCESS IN LINEAR AND INTERLEAVED ORDER

(75) Inventor: Erwin Hemming, Bocholt (DE)

(73) Assignee: Nokia Corporation, Espoo (FI)

( * ) Notice: Subject to any disclaimer, the term of this patent is extended or adjusted under 35 U.S.C. 154(b) by 283 days.

(21) Appl. No.: 10/611,919

(22) Filed: Jul. 3, 2003

(65) Prior Publication Data

US 2004/0168011 A1  Aug. 26, 2004

Related U.S. Application Data

(60) Provisional application No. 60/448,901, filed on Feb. 24, 2003.

(51) Int. Cl.
 *G06F 12/00* (2006.01)
(52) U.S. Cl. .......................................... 711/5; 711/157
(58) Field of Classification Search .................. None
 See application file for complete search history.

(56) References Cited

U.S. PATENT DOCUMENTS

| | | | | |
|---|---|---|---|---|
| 6,392,572 | B1* | 5/2002 | Shiu et al. .................... | 341/81 |
| 6,453,380 | B1* | 9/2002 | Van Lunteren ................ | 711/5 |
| 6,473,808 | B1* | 10/2002 | Yeivin et al. .................. | 710/6 |
| 2002/0128037 | A1* | 9/2002 | Schmidt ....................... | 455/553 |
| 2003/0018942 | A1* | 1/2003 | Seo ............................. | 714/786 |
| 2003/0063502 | A1* | 4/2003 | Merritt et al. ................ | 365/200 |
| 2003/0225985 | A1* | 12/2003 | Suzuki et al. ................ | 711/157 |

OTHER PUBLICATIONS

Giulietti, et al.; "Parrallel Turbo Coding Interleavers: Avoiding Collisions in Accesses to Storage Elements"; Electronics Letters, vol. 38, No. 5, Feb. 28, 2002, pp. 232-234.
Kwak, et al.; "Design Of Dividable Interleaver For Parallel Decoding In Turbo Codes"; Electronics Letters, vol. 38, No. 22, Oct. 24, 2002 pp. 1362-1364.
Richter, et al.; "Parallel Interleaving on Parallel DSP Architectures"; IEEE, Oct. 16, 2002, pp. 195-200.

* cited by examiner

*Primary Examiner*—Mano Padmanabhan
*Assistant Examiner*—Craig E Walter
(74) *Attorney, Agent, or Firm*—Squire, Sanders & Dempsey L.L.P.

(57) ABSTRACT

An interleaving method and apparatus provides parallel access in a linear and interleaved order to a predetermined number of stored data samples. A memory array with a plurality of memory devices is addressed by applying a first portion of an address to memory devices and by using a second portion of the address to select at least one memory device to be accessed, wherein the position of the first and second portions within the address is changed in response to a change between the linear order and the interleaved order. Due to the fact that the memory array is split into several individually addressable memory devices, each of these memory devices can be accessed in a linear and interleaved order by changing an allocation of a chip selection portion and a chip addressing portion of the address.

18 Claims, 5 Drawing Sheets

PRIOR ART

| Block | Clock Cycle | Symbol Access Scheme | | | | RAM Access Scheme | | | |
|---|---|---|---|---|---|---|---|---|---|
| | | Original | | Modified | | Linear | | Interleaved | |
| | | Linear | Interl. | Linear | Interl. | RAM | Addr | RAM | Addr |
| 1 | 1 | 0 | 933 | 0 | 933 | 1 | 0 | 1 | 933 |
| | 2 | 1 | 2833 | 1 | 2981 | 1 | 1 | 3 | 933 |
| | 3 | 2 | 1883 | 2 | 1957 | 1 | 2 | 2 | 933 |
| | 4 | 3 | 3783 | 3 | 4005 | 1 | 3 | 4 | 933 |
| 2 | 1 | 950 | 313 | 1024 | 313 | 2 | 0 | 1 | 313 |
| | 2 | 951 | 2213 | 1025 | 2361 | 2 | 1 | 3 | 313 |
| | 3 | 952 | 1263 | 1026 | 1337 | 2 | 2 | 2 | 313 |
| | 4 | 953 | 3163 | 1027 | 3385 | 2 | 3 | 4 | 313 |
| 3 | 1 | 1900 | 764 | 2048 | 764 | 3 | 0 | 1 | 764 |
| | 2 | 1901 | 2664 | 2049 | 2812 | 3 | 1 | 3 | 764 |
| | 3 | 1902 | 1714 | 2050 | 1788 | 3 | 2 | 2 | 764 |
| | 4 | 1903 | 3614 | 2051 | 3836 | 3 | 3 | 4 | 764 |
| 4 | 1 | 2850 | 65 | 3072 | 65 | 4 | 0 | 1 | 65 |
| | 2 | 2851 | 1965 | 3073 | 2113 | 4 | 1 | 3 | 65 |
| | 3 | 2852 | 1015 | 3074 | 1089 | 4 | 2 | 2 | 65 |
| | 4 | 2853 | 2915 | 3075 | 3137 | 4 | 3 | 4 | 65 |

Fig. 4

INTERLEAVING METHOD AND APPARATUS WITH PARALLEL ACCESS IN LINEAR AND INTERLEAVED ORDER

CROSS-REFERENCE TO RELATED APPLICATIONS

This application claims priority of U.S. Provisional Patent Application Ser. No. 60/448,901 entitled, "Interleaving Method and Apparatus with Parallel Access in Linear and Interleaved Order," filed Feb. 24, 2003, the entire contents of which are incorporated herein by reference.

BACKGROUND OF THE INVENTION

1. Field of the Invention

The present invention relates to an interleaving method and apparatus for providing parallel access in linear and interleaved order to a predetermined number of stored data samples, such as a turbo interleaver for a turbo decoder in mobile communication systems.

2. Description of the Related Art

Code concatenation is a practical technique for obtaining a code with a very long block length and a large error-correction capability. This is accomplished by combining two elementary codes. These codes have two distinct levels of encoding and decoding. The advantage of this coding scheme is that sequential decoding of the different codes can be performed. Thus, the decoding complexity of the overall code depends on the complexity of the decoder associated to each separate code used. This leads to a reduction of the decoding complexity.

The concept of turbo codes is an iterative decoding of two codes concatenated either in parallel or in serial using a Soft Input Soft Output (SISO) elementary decoder. Each elementary decoder therefore provides a decision and a likelihood ratio which quantifies the probability that the decision is correct. This information is passed to the next decoding stage in order to improve the bit error rate at each iteration. A turbo decoder can be implemented as certain number of pipelined identical elementary decoders depending on the number of iteration.

Turbo codes are able to achieve performances with a signal to noise ratio close to Shannon's theoretical limit, provided that the code is long enough and that a sufficiently large number of iterations is used in the iterative decoding process. Convolutional turbo codes are built using a parallel concatenation of two Recursive Systematic Convolutional (RSC) codes separated by a large random interleaver. The elementary decoder used in the iterative decoding process consists of two constituent SISO decoders, one for each RSC encoder, an interleaver and a deinterleaver. Further details are described for example in "Near Shannon limit error-correction coding: Turbo-Codes", C. Berrou et al, in Proc. IEEE ICC'93, Geneva, Switzerland, pp. 1064–1070, May 1993, incorporated herein by reference.

In general, the interleaver randomizes an address of an input information or codeword and improves a distance property of the code word. It has been decided to use a turbo code in data transmission channels of third generation mobile communication systems, e.g. in a data channel of UMTS (Universal Mobile Telecommunications System) proposed by ETSI (European Telecommunication Standards Institute).

FIG. 1 shows a schematic block diagram of a conventional interleaver as for example disclosed in document WO 00/70771 for interleaving frame data. An address generator 150 generates a read address for changing the sequence of input data bits according to an input frame data size and an input clock CLK, and provides an interleaver memory 100 with the generated read address RA. The interleaver memory 100 sequentially stores input data DI in a write mode of operation, and outputs the stored data as output data DO according to the read address provided from the address generator 150 in a read mode of operation. A counter 130 counts the input clock and provides the clock count value to the interleaver memory 100 as a write address WA. Thus, the interleaver sequentially stores input data in the interleaver memory 100 in the write mode of operation, and outputs the data stored in the interleaver memory 100 according to the read address provided from the address generator 150 in the read mode of operation. Alternatively, it is also possible to change the sequence of the input data bits before storing them in the interleaver memory in the write mode of operation, and sequentially read the stored data in the read mode of operation.

If such an interleaver scheme is to be provided with a parallel access to the stored data in linear and interleaved order, multiport random access memory (RAMs) are used with K (K>1) reading ports. However, such multiport RAMs require large chip areas and are very expensive. Moreover, multiport RAMs with K reading ports may not be available from each ASIC (Application Specific Integrated Circuit) vendor, or the maximum number of available ports is at least limited at several vendors.

SUMMARY OF THE INVENTION

It is therefore one objective of the present invention to provide an interleaving method and apparatus with a parallel access to the data in linear and interleaved order, which can be implement at reduced cost and chip area.

According to one embodiment, the invention provides an interleaving method for providing parallel access in linear and interleaved order to a predetermined number of stored data samples. The method comprises the steps of: storing the data samples in a memory array comprising a plurality of memory devices; using a first portion of an address of the memory array to address the memory devices; using a second portion of the address to select at least one memory device to be accessed; and changing the position of the first and second portions within the address, when the access order is changed between the linear order and the interleaved order.

According to another embodiment, the invention provides an interleaving apparatus for providing parallel access in linear and interleaved order to a predetermined number of stored data samples. The apparatus comprises: a memory array with a plurality of memory devices for storing the data samples; addressing means for addressing the memory devices by applying a first portion of an address to the memory devices and by using a second portion of the address to select at least one memory device to be accessed; and change means for changing the positions of the first and second portions within the address in response to a change between the linear order and the interleaved order.

Accordingly, by splitting the data memory into several smaller memories and changing the address portions in the interleaved order and linear order, each of the smaller memories can be accessed in linear and interleaved order without requiring multiport memory devices with several reading ports. During the linear access order, data symbols or samples of each data block can be accessed in a sequential order from each of the memory devices one after the other, while in the interleaved access order, data samples can be randomly accessed from the memory devices. Due to the changeable addressing scheme and split memory arrangement, each of the memory devices may need only one reading port.

The parallel access to the plurality of memory devices can be performed in a multiplex manner using the second address portion as a multiplexing index. Then, all memory devices can be accessed in a multiplexed manner within one clock cycle, such that the number of clock cycles for parallel reading can be reduced according to the degree of multiplexing, i.e. the number of multiplexed accesses within one clock cycle.

The second address portion may correspond to a predetermined number of most significant bits of the address during a linear order access and may correspond to a predetermined number of least significant bits of the address during an interleaved order access. In this case, the first address portion may correspond to the remaining bits of the address. Thereby, in the linear access order all data to be accessed from one memory device is sequentially read before the data of the next memory device is read, while in the interleaved access order each memory device is accessed only once before the next memory device is accessed.

The first address portion may be subjected to an interleaving process during an interleaved access order. Thereby, each memory device is accessed in accordance with the interleaving scheme, while a selection of the memory devices is performed based on the second address portion. As an example, the first address portion may comprise ten address bits and the second address portion may comprise two address bits. Thereby, a maximum number of 1024 memory locations of each memory device can be addressed, while four memory devices can be selected.

The first address portion may be generated by an address counting function.

Furthermore, the memory devices may be single-port RAM devices. The apparatus may be integrated in a single chip device.

An interleaving means may be provided for interleaving an output address of an address counter to generate the first address portion during an interleaved access order. In particular, the interleaving means may comprise an address translation ROM (Read-Only Memory).

The change means may comprise a controlled switch for receiving the address and for switching the first and second address portions to respective output ports in response to an access order selection signal.

Further advantageous modifications are described in the dependent claims.

BRIEF DESCRIPTION OF THE DRAWINGS

In the following the present invention will be described in greater detail based on a preferred embodiment with reference to the accompanying drawings in which:

FIG. 4 shows a table indicating an access scheme of the interleaving apparatus according to an embodiment of the invention.

DETAILED DESCRIPTION OF THE PREFERRED EMBODIMENTS

The preferred embodiment will now be described on the basis of an interleaver with parallel access to data in an interleaved and linear order, which may be applied in a turbo decoder. In particular, the interleaver comprises four RAM devices M1 to M4 and sixteen register memories to store sixteen data values or symbols B1 to B4, C1 to C4, D1 to D4 and E1 to E4 read from the four RAM devices M1 to M4 in four clock cycles. These sixteen data symbols B1 to E4 can then be used in the next four clock cycles in four constitutional decoders of the turbo decoder.

Figure 1:
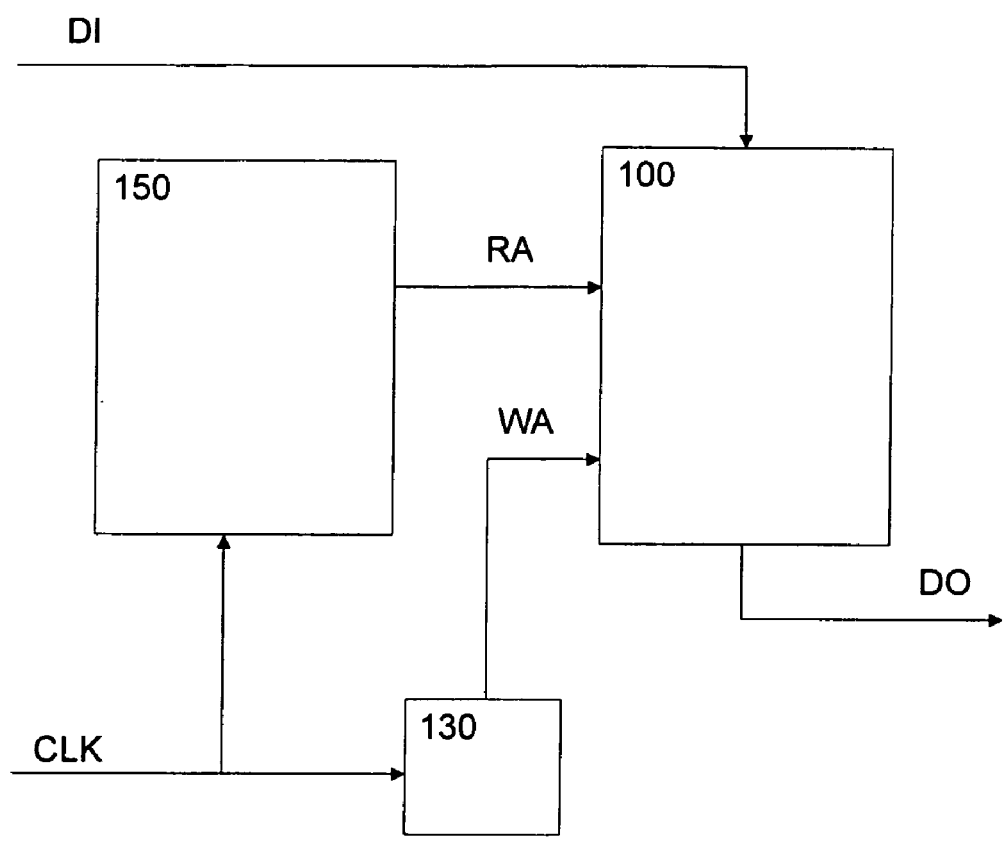
FIG. 1 shows a schematic block diagram of a conventional interleaver.
Figure 2:
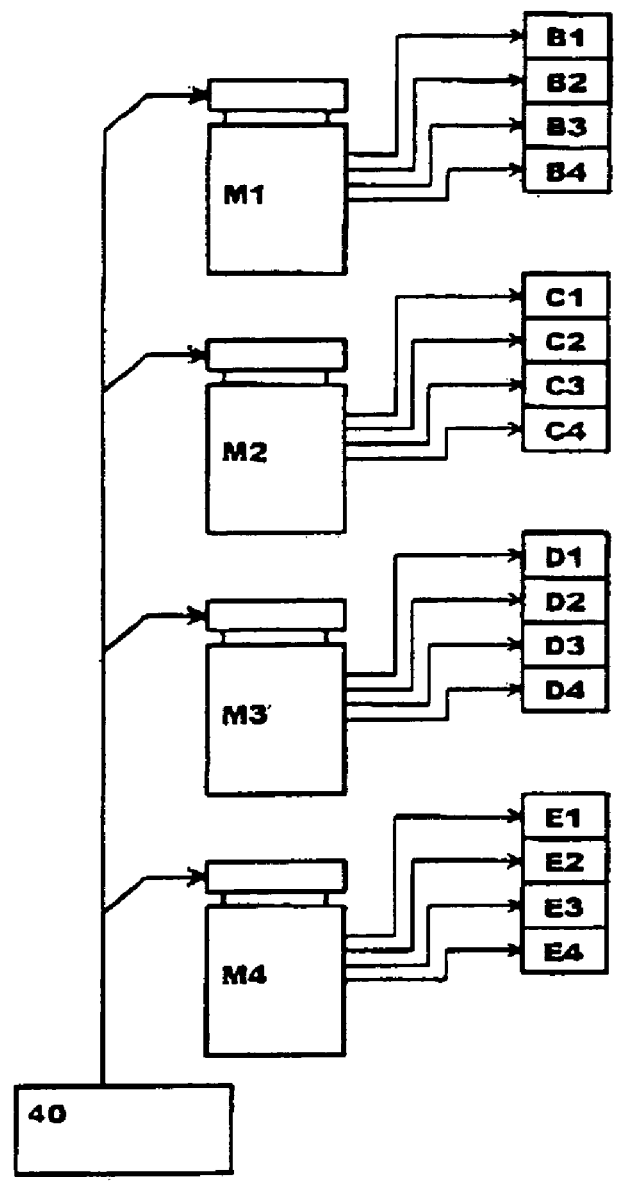
FIG. 2 shows a RAM access scheme in a linear addressing mode according to an embodiment of the invention.

FIG. 2 shows a corresponding RAM access scheme in the linear addressing mode where the four consecutive blocks of four data symbols B1 to E4 are accessed in four clock cycles from each of the RAM devices M1 to M4 based on an address output from a 10-bit address counter 40.

In the present example according to the preferred embodiment, an array of N data symbols is divided in K blocks, where K is a power of 2. The interleaving scheme will be explained based on the present example, where K=4 and N=3800, which means that 3800 data symbols are divided to four blocks and stored in the respective RAM devices M1 to M4. Hence, each of the RAM devices M1 to M4 contains 3800/4=950 data symbols. The whole memory array consisting of the four RAM devices M1 to M4 is accessed by using 12 address bits of which 10 bits are used to access the RAM devices M1 to M4.

In the linear access order shown in FIG. 2, the first RAM device M1 is first selected based on the most significant address bits A11 and A10 of the 12-bit array address, while the remaining address bits A9 to A0 are used to sequentially select the data symbols B1 to B4 during the first clock cycle. In the second clock cycle, the second RAM device M2 is selected by the most significant address bits A11 and A10 to sequentially read the following four data symbols C1 to C4. Then, the third RAM device M3 is selected and addressed during the third clock cycle to sequentially read the four data symbols D1 to D4, and the fourth RAM device M4 is selected and addressed during the fourth clock cycle to sequentially read the data symbols E1 to E4. Accordingly, in this example, the address counter 40 is controlled to cyclically generate a sequence of four 10-bit addresses for addressing the respective memory locations in which the data symbols are stored.

In the linear access order of the above case of N=3800 data symbols, the linear addressing can be obtained by providing the 10-bit address counter 40 with a counting function for counting up from 0 to a maximum address value of 949 depending on the number of data symbols in each data block. Furthermore, a 2-bit RAM multiplex index generates the two most significant address bits A11 and A10 for a parallel access to respective output registers.

Due to the fact that not all possible 4096 addresses are used, but only a number of 3800, the decimal address values of the second to fourth RAM devices M2 to M4 can be calculated according to following equation:

$$A_M = A_0 + (1024 - 950) \times (A_0 / 950)$$

wherein $A_M$ indicates the decimal value corresponding to the 12-bit address of the whole array including the 2-bit RAM multiplex index and $A_0$ indicates the direct index of the data symbols without considering the address gaps caused by the partial usage of the memory capacity. Hence, the symbol index $A_O$ ranges from 0 to 949 in the first RAM device M1, from 950 to 1899 in the second RAM device M2, from 1900 to 2849 in the third RAM device M3, and from 2850 to 3799 in the fourth RAM device M4, while the modified address or array address $A_M$ ranges from 0 to 949 for the first RAM device M1, from 1024 to 1973 for the second RAM device M2, from 2048 to 2997 for the third RAM device M3, and from 3072 to 4021 for the fourth RAM device M4. It is noted that the modified address $A_M$ corresponds to the array address where the two most significant bits A11 and A10 are set according to the multiplex index used for selecting the respective one of the RAM devices M1 to M4.

Figure 3:
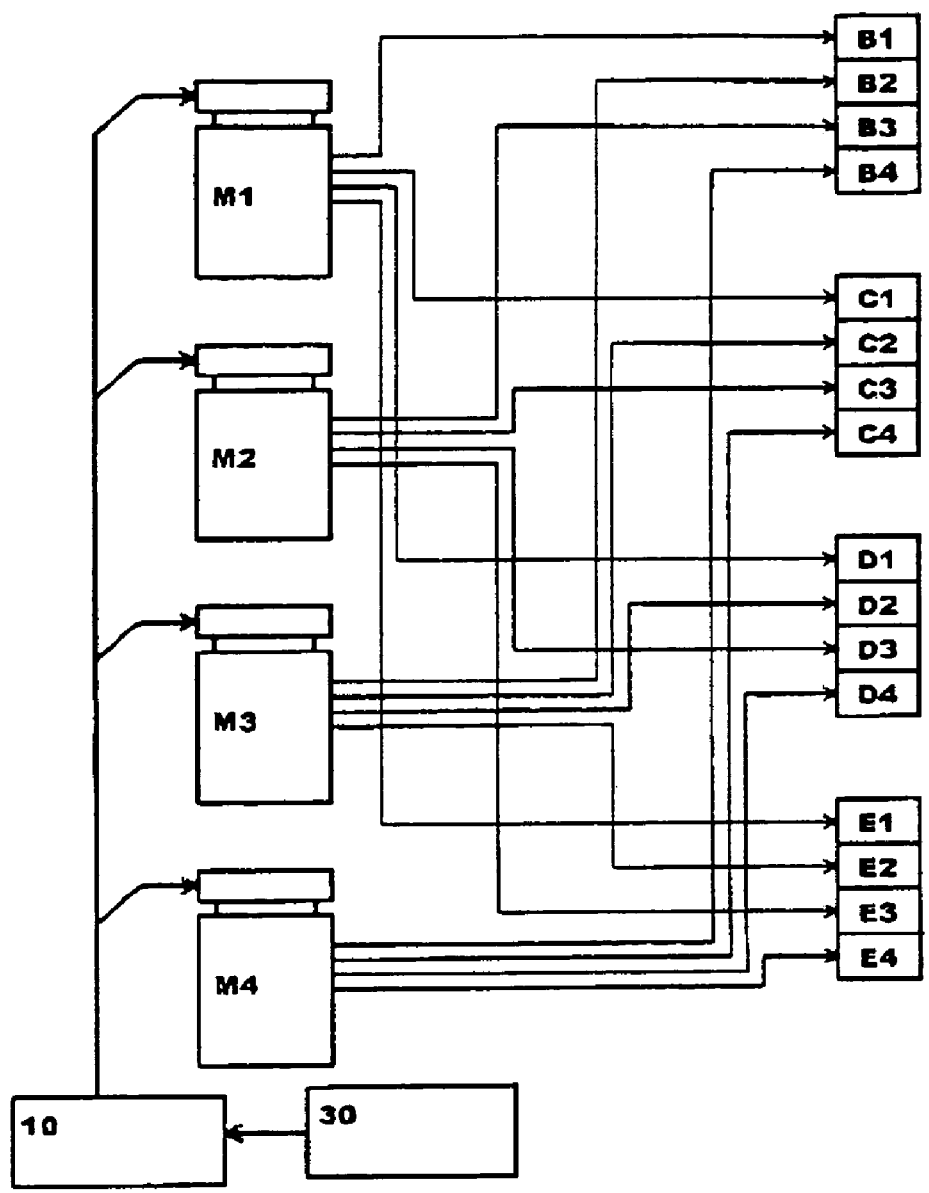
FIG. 3 shows a RAM access scheme for an interleaved addressing mode according to an embodiment of the invention.

FIG. 3 shows a RAM access scheme for four consecutive symbols in four clock cycles in an interleaved addressing mode achieved by supplying the memory address generated by the 10-bit address counter 30 to the RAM devices M1 to M4 via an interleaver addressing ROM 10 which converts the linear or sequential address into a random address according to a predetermined interleaving scheme. As can be gathered from FIG. 3, the first four data symbols B1 to B4 are now no longer obtained solely from the first RAM device M1, but from each of the four RAM devices M1 to M4, wherein the first data symbol B1 is obtained from the first RAM device M1, the second data symbol B2 is obtained from the third RAM device M3, the third data symbol B3 is obtained from the second RAM device M2, and the fourth data symbol B4 is obtained from the fourth RAM device M4. The same applies to the remaining blocks of consecutive data symbols C1 to C4, D1 to D4 and E1 to E4. It is noted that this non-linear addressing scheme is generated by applying a corresponding sequence of array addresses which determines the selection of the RAM devices M1 to M4 and their respective memory locations.

According to the preferred embodiment, the interleaving scheme can be achieved by supplying ten address bits of the 12-bit array address to the interleaver addressing ROM 10 and using the remaining two address bits for generating the multiplex index for the RAM selection function. In the preferred embodiment, the address for the interleaving access order can be derived from the 12-bit array address as follows:

INTERL(A0, A1), INTERL (A11, A10, A9, A8, A7, A6, A5, A4, A3, A2)

Accordingly, the two least significant bits A0 and A1 of the 12-bit array address are now used as multiplex index for RAM selection, which may be obtained from an optional 2-bit interleaver, and the ten most significant bits are supplied to the interleaver addressing ROM 10 to generate the RAM address for addressing the RAM devices M1 to M4. The described interleaver function INTERL(x) which determines the content of the interleaver addressing ROM 10 can be based on any standard interleaver function, such as the interleaver function used in the UMTS Turbo-Decoder according to the ETSI specification.

Due to the fact that the two least significant bits A0 and A1 are now used for RAM selection, consecutive data symbols are read from different ones of the RAM devices M1 to M4 as indicated in FIG. 3.

In the cases of FIGS. 2 and 3, where four consecutive symbols are read from each block in linear and interleaved order, respectively, which leads to the following reading order of symbol indexes in the linear access mode, assuming that the first memory addresses are used in each of the RAM devices M1 to M4:

M1: symbol index: 0, 1, 2, 3 which corresponds to the modified or array addresses 0, 1, 2, 3;
M2: symbol index: 950, 951, 952, 953 which corresponds to the modified addresses 1024, 1025, 1026, 1027;
M3: symbol index: 1900, 1901, 1902, 1903 which corresponds to the modified addresses 2048, 2049, 2050, 2051; and
M4: symbol index: 2850, 2851, 2852, 2853 which corresponds to the modified addresses 3072, 3073, 3074, 3075.

As can be gathered from the above generation scheme of the interleaving address, the interleaving address only depends on the 10 most significant bits A11 to A2 of the modified address $A_M$. Therefore, in present case where only the first four consecutive symbols of each RAM device are read, the ten most significant address bits will not be influenced during address counting of each RAM device M1 to M4. In particular, the ten most significant bits of the modified address $A_M$ all remain "0" for the first RAM device M1, correspond to the decimal value "512" for the second RAM device M2, correspond to the decimal value "256" for the third RAM device M3, and correspond to the decimal value "768" for the fourth RAM device M4. The interleaver function which may be extracted from the UMTS Turbo Interleaver generates the following four addresses at the output of the interleaver addressing ROM 10:

INTERL(0)=933
INTERL(256)=313
INTERL(512)=764
INTERL(768)=65

FIG. 4 shows a table indicating the access scheme of the interleaver according to the preferred embodiment for the above example of an access of four consecutive symbols in four clock cycles.

Starting from the left side of the table, the first column indicates a block index of the read data block, the second column indicates the clock cycle, the third column indicates the symbol index in the linear access order, the fourth column indicates the symbol index in the interleaved access order, the fifth column indicates the modified address or array address in the linear access order, the sixth column indicates the modified or array address in the interleaved access order, the seventh column indicates the number of the accessed RAM device in the linear access order, the eighth column indicates the multiplex index or address of the accessed RAM device in the linear access order, the ninth column indicates the number of the accessed RAM device in the interleaved access order, and the tenth column indicates the 10-bit RAM address applied to the RAM devices in the interleaved access order which corresponds to the output of the interleaver addressing ROM 10.

As can be gathered from the above access scheme of FIG. 4, a change from the interleaved to the linear access order and vice versa is simply achieved by changing address portions used for RAM addressing and RAM selection, and supplying the RAM address to an interleaver functionality during the interleaved access order.

Figure 5:
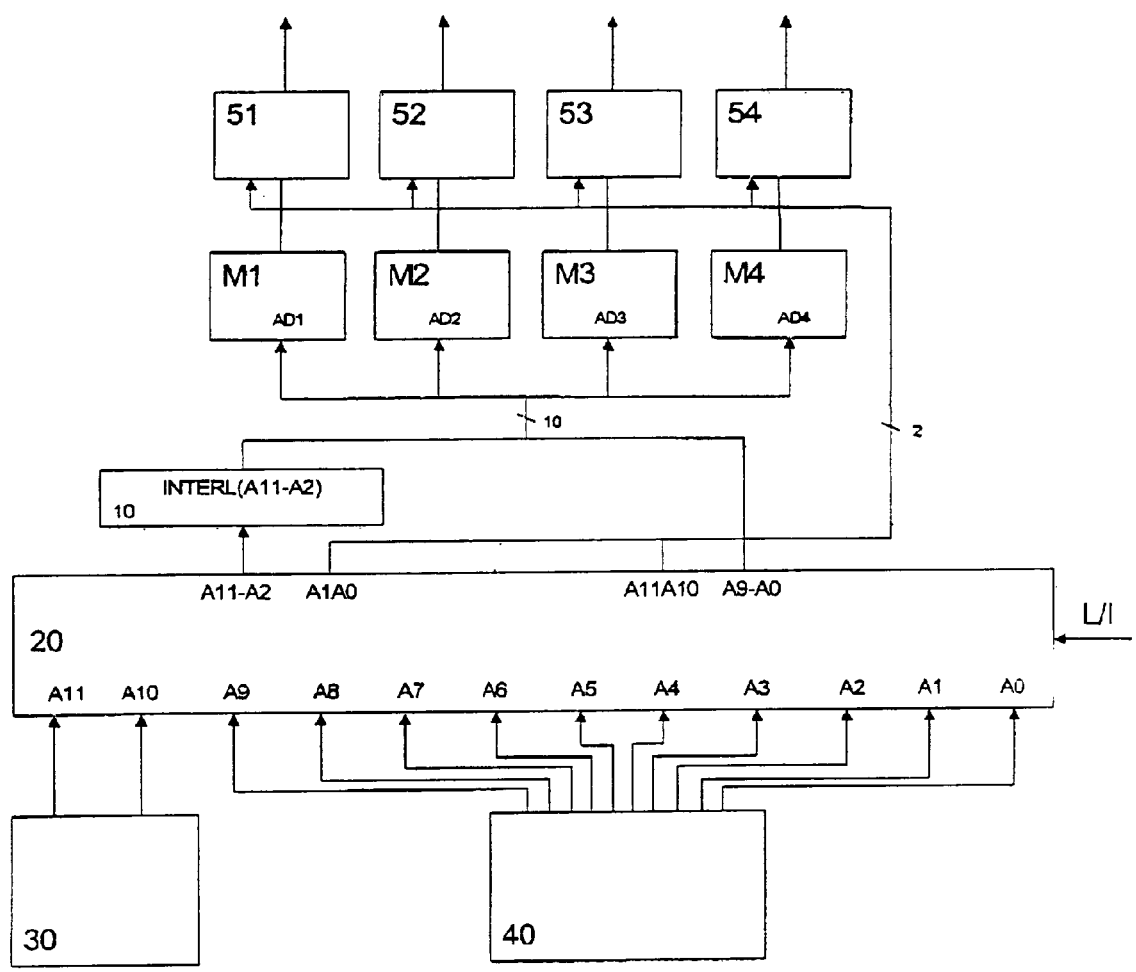
FIG. 5 shows a schematic block diagram of the interleaving apparatus according to an embodiment of the invention.

FIG. 5 shows a schematic block diagram of an implementation example of the interleaver with parallel access in linear and interleaved order according to the preferred embodiment.

An address counter 40 operates according to a linear counting scheme to generate a 10-bit address comprising address bits A9 to A0, and a 2-bit index counter 30 outputs a cyclic 2-bit multiplex index comprising two bits A11 and A10. The twelve output signals of the address counter 40 and the index counter 30 are supplied to a controllable switching unit 20 having a demultiplexing functionality for either supplying the most significant address bits A11 to A2 at a first port and the least significant address bits A1 and A0 at a second output port, or supplying the most significant address bits A11 and A10 at a third output port and the least significant address bits A9 to A0 at a fourth output port, based on a control signal L/I used for selecting a linear or interleaved access order. The output ports may be arranged in a tri-state technology, such that the two non-used output ports are set to a high impedance level.

If the linear access order is selected by the control signal L/I, the ten least significant address bits A9 to A0 which correspond to the output of the address counter 40 are applied in parallel to respective address ports AD1 to AD4 of the RAM devices M1 to M4, and the most significant address bits A11 and A10 which correspond to the output of the index counter 30 are used as multiplex signals and are supplied to respective multiplexing inputs of corresponding register arrays 51 to 54 provided at the outputs of the RAM devices M1 to M4. The read data symbols are output from the RAM devices M1 to M4 to the register arrays 51 to 54 in which the consecutive data symbols of the data blocks, e.g. B1 to B4, C1 to C4, D1 to D4 and E1 to E4, are temporarily stored for further processing.

If the interleaved access order is selected by the control signal L/I, the most significant address bits A11 to A2 are supplied via the interleaver addressing ROM 10 which maps the above interleaving function INTERL(A11–A2) to the address ports AD1 to AD4 of the RAM devices M1 to M4. Furthermore, the least significant bits A1 and A0 are supplied to the multiplexing inputs of the register arrays 51 to 54. Thereby, an interleaved access scheme as indicated in FIG. 3 can be obtained.

It is noted that other suitable controllable switching functions may be applied for changing the allocation of the address bits to the multiplexing function and the RAM addressing function. Furthermore, the interleaver addressing ROM 10 may be any kind of look-up table or logic suitable to implement the required interleaving function, and a corresponding additional interleaving function may be provided for the least significant bits A0 and A1 in the interleaved access order. Moreover, any suitable allocation of address portions or address bits can be used to change between the linear and the interleaved access order. The single-port RAM devices M1 to M4 may be replaced by two dual-port RAMs. In case of a higher number of parallel output values, even two or more multiport RAMs may be used, while still reducing overall complexity and size of the interleaver. The preferred embodiment may thus vary within the scope of the claims.

The invention claimed is:

1. An interleaving method for performing parallel access in a linear and interleaved order to a predetermined number of stored data samples, said method comprising the steps of:
   a) storing data samples in a memory array comprising a plurality of memory devices;
   b) using a first portion of an address of said memory array to address said memory devices;
   c) using a second portion of said address to select at least one memory device to be accessed;
   d) changing a position of said first portion and said second portion within said address, when an access order is changed between a linear order and an interleaved order; and
   e) performing a parallel access in a multiplexed manner using said second portion of said address portion as a multiplexing index.

2. A method according to claim 1, wherein said second portion of said address corresponds to a predetermined number of most significant bits of said address during a linear access order, and corresponds to a predetermined number of least significant bits of said address during an interleaved access order.

3. A method according to claim 2, wherein said first portion of said address corresponds to a remaining number of bits within said address.

4. A method according to claim 1, further comprising the step of subjecting said first portion of said address to an interleaving processing during an interleaved access order.

5. A method according to claim 1, wherein said first portion of said address comprises ten address bits and said second portion of said address comprises two address bits.

6. A method according to claim 1, further comprising the step of generating said first portion of said address by an address counting function.

7. An interleaving apparatus for providing parallel access in a linear and interleaved order to a predetermined number of stored data samples, said interleaving apparatus comprising:
   a) a memory array with a plurality of memory devices for storing data samples;
   b) addressing means for addressing said memory devices by applying a first portion of an address to said memory devices and by using a second portion of said address to select at least one memory device to be accessed;
   c) change means for changing a position of said first portion and said second portion within said address in response to a change between a linear order and interleaved order; and
   d) means for performing a parallel access in a multiplexed manner using said second portion of said address portion as a multiplexing index.

8. An apparatus according to claim 7, wherein said memory devices are single-port RAM devices.

9. An apparatus according to claim 7, wherein said interleaving apparatus is integrated on a single chip device.

10. An apparatus according to claim 7, wherein said addressing means comprises an address counter for generating said first address.

11. An apparatus according to claim 10, further comprising interleaving means for converting an output address of said address counter according to a predetermined interleaving scheme to generate said first portion of said address during an interleaved access order.

12. An apparatus according to claim 11, wherein said interleaving means comprises at least one of an address translation table and an address logic.

13. An apparatus according to claim 7, wherein said change means comprises a control switch for receiving said address and for switching said first portion and second portion within said address to respective output parts in response to an access order selection signal.

14. An apparatus according to claim 7, wherein said interleaving apparatus comprises a turbo interleaver for use in a turbo decoder.

15. An interleaving apparatus for providing parallel access in a linear and interleaved order to a predetermined number of stored data samples, said interleaving apparatus comprising:
   a) a memory array with a plurality of memory devices for storing data samples;
   b) an addresser configured to address said memory devices by applying a first portion of an address to said memory device and by using a second portion of said address to select at least one memory device to be accessed;

c) a changer configured to change a position of said first portion and said second portion within said address in response to a change between a linear order and an interleaved order; and d) an access provider configured to provide a parallel access in a multiplexed manner using said second portion of said address portion as a multiplexing index.

16. An interleaving apparatus for providing parallel access in a linear and interleaved order to a predetermined number of stored data samples, said interleaving apparatus comprising:

a) a memory array with a plurality of memory devices for strong data samples;

b) addressing means for addressing said memory devices by applying a first portion of an address to said memory devices and by using a second portion of said address to select at least one memory device to be accessed, wherein said addressing means comprises an address counter for generating said first address;

c) change means for changing a position of said first portion and said second portion within said address in response to a change between a linear order and interleaved order; and d) interleaving means for converting an output address of said address counter according to a predetermined interleaving scheme to generate said first portion of said address during an interleaved access order.

17. An apparatus according to claim 16, wherein said interleaving means comprises at least one of an address translation table and an address logic.

18. An interleaving apparatus for providing parallel access in a linear and interleaved order to a predetermined number of stored data samples, said interleaving apparatus comprising:

a) a memory array with a plurality of memory devices for storing data samples;

b) addressing means for addressing said memory devices by applying a first portion of an address to said memory devices and by using a second portion of said address to select at least one memory device to be accessed, wherein said addressing means comprises an address counter for generating said first address;

c) change means for changing a position of said first portion and said second portion within said address in response to a change between a linear order and interleaved order, wherein said change means comprises a control switch for receiving said address and for switching said first portion and second portion within said address to respective output parts in response to an access order selection signal.

* * * * *